United States Patent
Kim et al.

(10) Patent No.: US 8,716,046 B2
(45) Date of Patent: May 6, 2014

(54) LIGHT EMITTING DEVICE AND METHOD FOR MANUFACTURING THE SAME

(75) Inventors: Gyu Beom Kim, Ansan-si (KR); Sang Joon Lee, Ansan-si (KR); Chang Suk Han, Ansan-si (KR); Kwang Choong Kim, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 12/535,244

(22) Filed: Aug. 4, 2009

(65) Prior Publication Data

US 2009/0291519 A1    Nov. 26, 2009

Related U.S. Application Data

(62) Division of application No. 12/193,588, filed on Aug. 18, 2008.

(30) Foreign Application Priority Data

Mar. 25, 2008    (KR) .................. 10-2008-0027494

(51) Int. Cl.
    *H01L 21/00*    (2006.01)
(52) U.S. Cl.
    USPC .............................................. 438/46; 257/13
(58) Field of Classification Search
    USPC ........................................ 257/13; 438/46, 47
    See application file for complete search history.

(56) References Cited

U.S. PATENT DOCUMENTS

| | | | |
|---|---|---|---|
| 5,270,247 A * | 12/1993 | Sakuma et al. | 117/89 |
| 5,994,158 A * | 11/1999 | Kashima et al. | 438/47 |
| 6,266,355 B1 | 7/2001 | Sverdlov | |
| 6,998,284 B2 | 2/2006 | Kyono et al. | |
| 7,683,379 B2 | 3/2010 | Goto et al. | |
| 2002/0025661 A1 | 2/2002 | Nikolaev et al. | |
| 2004/0004223 A1 | 1/2004 | Nagahama et al. | |
| 2006/0191474 A1* | 8/2006 | Chen et al. | 117/104 |
| 2006/0267025 A1 | 11/2006 | Wuu et al. | |
| 2008/0003838 A1* | 1/2008 | Haukka et al. | 438/765 |
| 2009/0152529 A1 | 6/2009 | Chua et al. | |

FOREIGN PATENT DOCUMENTS

| | | |
|---|---|---|
| EP | 1 220 304 | 7/2002 |
| EP | 1 883 140 | 1/2008 |
| JP | 05-110139 | 4/1993 |
| JP | 2001-156003 | 6/2001 |

(Continued)

OTHER PUBLICATIONS

Office Action issued Feb. 25, 2010 in co-pending U.S. Appl. No. 12/193,588.

(Continued)

*Primary Examiner* — Yu-Hsi D Sun
(74) *Attorney, Agent, or Firm* — H.C. Park & Associates, PLC (57) ABSTRACT

Disclosed herein is a light emitting device. The light emitting device includes an n-type nitride semiconductor layer; an active layer on the n-type semiconductor layer, an AlN/GaN layer of a super lattice structure formed by alternately growing an AlN layer and a GaN layer on the active layer, and a p-type nitride semiconductor layer on the AlN/GaN layer of the super lattice structure. At least one of the AlN layer and the GaN layer is doped with a p-type dopant. A method for manufacturing the light emitting device is also provided.

6 Claims, 4 Drawing Sheets

(56) References Cited

FOREIGN PATENT DOCUMENTS

| | | |
|---|---|---|
| JP | 2006-128527 | 5/2006 |
| JP | 2006-245066 | 9/2006 |
| JP | 2008-034852 | 2/2008 |
| WO | 2005/117152 | 12/2005 |

OTHER PUBLICATIONS

Final Office Action dated Jun. 4, 2010 in U.S. Appl. No. 12/193,588.
Non-Final Office Action of U.S. Appl. No. 12/775,119 issued on Oct. 19, 2011.
Notice of Allowance of U.S. Appl. No. 13/150,759 was mailed Mar. 6, 2013.
Final Office Action dated Feb. 6, 2012 issued for U.S. Appl. No. 12/775,119.
Non-Final Office Action dated Nov. 6, 2012 issued for U.S. Appl. No. 13/150,759.
M. Iwaya, et al. "UV-LED Using p-Type GaN/AlN Supperlattice Cladding Layer", Phys. Stat. Sol. (c) vol. 0, No. 1. pp. 34-38 (2002).
European Search Report dated Jul. 19, 2012, issued in EP Patent Application No. 08012675.8.
Non-Final Office Action issued on Jul. 15, 2013 in U.S. Appl. No. 12/193,588.
Notice of Allowance issued on Jan. 28, 2014 in U.S. Appl. No. 12/775,119.

* cited by examiner

LIGHT EMITTING DEVICE AND METHOD FOR MANUFACTURING THE SAME

CROSS REFERENCE TO RELATED APPLICATION

This application is a divisional of U.S. patent application Ser. No. 12/193,588, filed on Aug. 18, 2008, and claims priority from and the benefit of Korean Patent Application No. 10-2008-0027494, filed on Mar. 25, 2008, which are all hereby incorporated by reference for all purposes as if fully set forth herein.

BACKGROUND OF THE INVENTION

1. Field of the Invention

The present invention relates to a light emitting device and a method for manufacturing the same. More particularly, the present invention relates to a light emitting device that has a p-type AlN/GaN layer of a super lattice structure between a p-type nitride semiconductor layer and an active layer, and to a method for manufacturing the same.

2. Description of the Related Art

Generally, nitride-based semiconductors are widely used in blue/green light emitting diodes or laser diodes for light sources of full-color displays, traffic lights, general lighting fixtures, optical communication devices, etc. The nitride-based semiconductor includes an active layer of a multi-quantum well structure disposed between n-type and p-type nitride semiconductor layers to emit light by recombination of electrons and holes in the active layer.

The nitride semiconductors are generally formed by metal-organic chemical vapor deposition. In the metal-organic chemical vapor deposition, an organic source gas containing group III metal is supplied into a reaction chamber, where a substrate is located, to grow a nitride semiconductor layer on the substrate.

The p-type nitride semiconductor layer includes p-AlGaN as an electronic blocking layer (EBL) and is doped with Mg, which is combined with hydrogen, deteriorating crystallinity of the p-type nitride semiconductor layer while deteriorating electrical conductivity of the p-type nitride semiconductor layer. The use of Mg as a dopant results in an increase of current leakage, deterioration of reverse voltage characteristics, and lower current diffusion of the light emitting device, which decreases luminescence efficiency and brightness of the light emitting device.

To lower driving voltage of a GaN-based semiconductor light emitting device while improving output thereof, it is necessary to improve the electrical conductivity of the p-type nitride semiconductor layer. However, an increase in doping concentration of Mg causes a decrease of carrier concentration, what is referred to as the self-compensation phenomenon.

Therefore, there is a need to improve electrical conductivity and crystallinity of the p-type semiconductor layer by sufficiently increasing the doping concentration of Mg.

SUMMARY OF THE INVENTION

The present invention provides a light emitting device that includes a p-type nitride semiconductor layer with improved electrical conductivity and/or crystallinity, and a method for manufacturing the same.

The present invention discloses a light emitting device, including: an n-type nitride semiconductor layer; an active layer on the n-type nitride semiconductor layer; an AlN/GaN layer of a super lattice structure formed by alternately growing an AlN layer and a GaN layer on the active layer; and a p-type nitride semiconductor layer on the AlN/GaN layer of the super lattice structure, wherein at least one of the AlN layer and the GaN layer is doped with a p-type dopant.

The p-type nitride semiconductor layer may be a p-GaN layer.

The AlN/GaN layer of the super lattice structure may have an identical amount of p-type dopant in each pair of AlN layer and GaN layer alternately grown on the active layer.

The AlN/GaN layer of the super lattice structure may have a variable amount of p-type dopant in each pair of AlN layer and GaN layer alternately grown on the active layer.

The p-type dopant may be Mg or Zn.

The AlN layer may be a p-type AlN layer doped with the p-type dopant.

In the AlN/GaN layer of the super lattice structure, the GaN layer may be thicker than the AlN layer.

The present invention also discloses a method for manufacturing a light emitting device that includes: forming an n-type nitride semiconductor layer on a substrate; forming an active layer on the n-type nitride semiconductor layer; forming an AlN/GaN layer of a super lattice structure by alternately growing an AlN layer and a GaN layer on the active layer; and forming a p-type nitride semiconductor layer on the AlN/GaN layer of the super lattice structure, wherein at least one of the AlN layer and the GaN layer is doped with a p-type dopant.

The p-type nitride semiconductor layer may be a p-GaN layer.

In the AlN/GaN layer of the super lattice structure, the GaN layer may be thicker than the AlN layer.

The forming of an AlN/GaN layer of a super lattice structure may be performed in a reaction chamber, and include: (a) supplying source gases comprising a p-type dopant source gas, an N source gas, and an Al source gas into the reaction chamber to grow a p-type AlN layer doped with the p-type dopant on the active layer; (b) supplying $NH_3$ gas while stopping the growth of the p-type AlN layer by stopping the supply of the p-type dopant source gas and the Al source gas into the reaction chamber; (c) supplying $NH_3$ gas and a Ga source gas into the reaction chamber to grow a u-GaN layer on the p-type AlN layer; (d) supplying $NH_3$ gas while stopping the growth of the u-GaN layer by stopping the supply of the Ga source gas; and repeating (a) to (d) until the AlN/GaN layer of the super lattice structure is formed on the active layer.

The method may further include supplying source gases comprising the Ga source gas, the N source gas, and the p-type dopant source gas into the reaction chamber to grow the p-type nitride semiconductor layer doped with the p-type dopant on the substrate, after the forming of an AlN/GaN layer of a super lattice structure.

When repeating (a) to (d), the p-type dopant source gas may be supplied in an identical flow into the reaction chamber.

When repeating (a) to (d), the p-type dopant source gas may be supplied in different flows into the reaction chamber.

The forming of an AlN/GaN layer of a super lattice structure may be performed in a reaction chamber, and include: (a) supplying source gases comprising a p-type dopant source gas, an N source gas, and an Al source gas into the reaction chamber to grow a p-type AlN layer doped with the p-type dopant on the active layer; (b) supplying $NH_3$ gas while stopping the growth of the p-type AlN layer by stopping the supply of the p-type dopant source gas and the Al source gas into the reaction chamber; (c) supplying the p-type dopant source gas, a Ga source gas, and NH$_3$ gas into the reaction chamber to grow a p-GaN layer on the p-type AlN layer; (d) supplying NH$_3$ gas while stopping the growth of the p-GaN layer by stopping the supply of the p-type dopant source gas and the Ga source gas; and repeating (a) to (d) until the AlN/GaN layer of the super lattice structure is formed on the active layer.

The forming of an AlN/GaN layer of a super lattice structure may be performed in a reaction chamber, and include: (a) supplying source gases comprising an N source gas and an Al source gas into the reaction chamber to grow the AlN layer on the active layer; (b) supplying NH$_3$ gas while stopping the growth of the AlN layer by stopping the supply of the Al source gas into the reaction chamber; (c) supplying a p-type dopant source gas, a Ga source gas, and NH$_3$ gas into the reaction chamber to grow a p-GaN layer on the AlN layer; (d) supplying NH$_3$ gas while stopping the growth of the p-GaN layer by stopping the supply of the p-type dopant source gas and the Ga source gas; and repeating (a) to (d) until the AlN/GaN layer of the super lattice structure is formed on the active layer.

The p-type dopant may be Mg or Zn, and the p-type dopant source gas may be CP$_2$Mg or DMZn.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF THE INVENTION

Exemplary embodiments of the present invention will be described in detail with reference to the accompanying drawings hereinafter.

Figure 1:
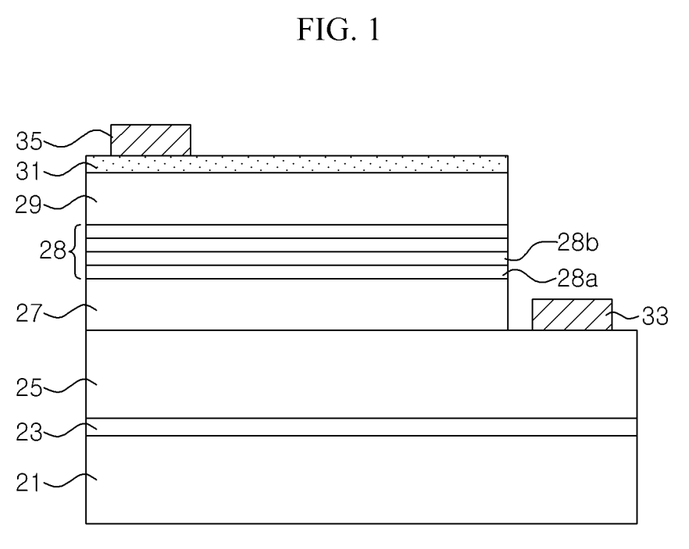
FIG. 1 is a cross-sectional view illustrating a light emitting device according to one embodiment of the present invention.

FIG. 1 is a cross-sectional view illustrating a light emitting device according to one embodiment of the present invention.

Referring to FIG. 1, the light emitting device includes an n-type nitride semiconductor layer 25, an active layer 27, an AlN/GaN layer of a super lattice structure 28, and a p-type nitride semiconductor layer 29. Further, the light emitting device may include a substrate 21, a buffer layer 23, a transparent electrode layer 31, an n-electrode 33, and a p-electrode 35.

The substrate 21 refers to a wafer used for manufacturing a nitride-based light emitting device. The substrate is generally made of sapphire (Al$_2$O$_3$) or silicon carbide (SiC), but the present invention is not limited thereto. The substrate may be a heterogeneous substrate, such as Si, GaAs, spinel, etc., or a homogeneous substrate, such as GaN, suitable for growing a nitride semiconductor layer thereon.

The buffer layer 23 serves to relieve the lattice mismatch between the substrate 21 and the nitride semiconductor layer during growth of the nitride semiconductor layer on the substrate 21. The buffer layer 23 may be formed of an InAlGaN, SiC or ZnO-based material.

The n-type nitride semiconductor layer 25 is generally formed of GaN, but the present invention is not limited thereto. That is, the n-type nitride semiconductor layer 25 may be formed of an (Al, In, Ga)N-based binary or quarternary nitride semiconductor. The n-type nitride semiconductor layer 25 may be formed of a single layer or multiple layers, and may include a super lattice layer.

The active layer 27 may have a single quantum well structure or a multi-quantum well structure. For the active layer of the multi-quantum well structure, a quantum barrier layer and a quantum well layer are alternately stacked 2 or more times to 20 or less times. The composition of the active layer 27 is determined according to luminescence wavelengths needed. For emitting green or blue light, InGaN is suitable for the active layer (quantum well layer). The quantum barrier layer is formed of nitride, for example, GaN or InGaN, which has a higher band gap than that of the quantum well layer.

The AlN/GaN layer of the super lattice structure 28 is formed by alternately growing an AlN layer 28a and a GaN layer 28b between the active layer 27 and the p-type nitride semiconductor layer 29. The AlN/GaN layer of the super lattice structure 28 can block dislocations from spreading into the p-type nitride semiconductor layer 29 on the AlN/GaN layer, thereby improving the hole concentration and crystallinity of the p-type nitride semiconductor layer 29. Further, the AlN/GaN layer 28 of the super lattice structure can prevent diffusion of Mg in the AlN/GaN layer to allow suitable doping of Mg. Here, in the AlN/GaN layer 28, at least one of the AlN layer and the GaN layer is doped with a p-type dopant. For example, the AlN/GaN layer 28 may be constituted by any combination of Mg doped p-type AlN and u-GaN, Mg undoped AlN and Mg doped p-GaN, or Mg doped p-type AlN and Mg doped p-GaN. Although Mg is used as the p-type dopant in this embodiment, the present invention is not limited to Mg and may employ Zn.

Additionally, in the AlN/GaN layer of the super lattice structure 28, the GaN layer 28b is preferably thicker than the AlN layer 28a. With this configuration, it is possible to prevent an increase of Vf and deterioration of crystallinity.

The p-type nitride semiconductor layer 29 is generally formed of GaN, but the present invention is not limited thereto. That is, the p-type nitride semiconductor layer 29 may be formed of an (Al, In, Ga) N-based binary or quarternary nitride semiconductor. The p-type nitride semiconductor layer 29 is formed using Mg as a dopant.

The transparent electrode layer 31 is disposed on the p-type nitride semiconductor layer 29 and may be formed of a transparent metallic layer such as Ni/Au or a conductive oxide such as ITO.

The n-electrode 33 is formed on the n-type nitride semiconductor layer 25, and the p-electrode 31 is formed on the transparent electrode layer 31. The n-electrode and p-electrode may be formed of various metallic materials such as Ti/Al and the like.

The buffer layer, n-type nitride semiconductor layer, and active layer can be formed by various techniques such as metal-organic chemical vapor deposition (MOCVD), molecular beam epitaxy (MBE), hydride vapor phase epitaxy, and the like. Generally, MOCVD is used in the related art. Therefore, a method of forming the p-type nitride semiconductor layer by MOCVD will be described below.

Figure 2:
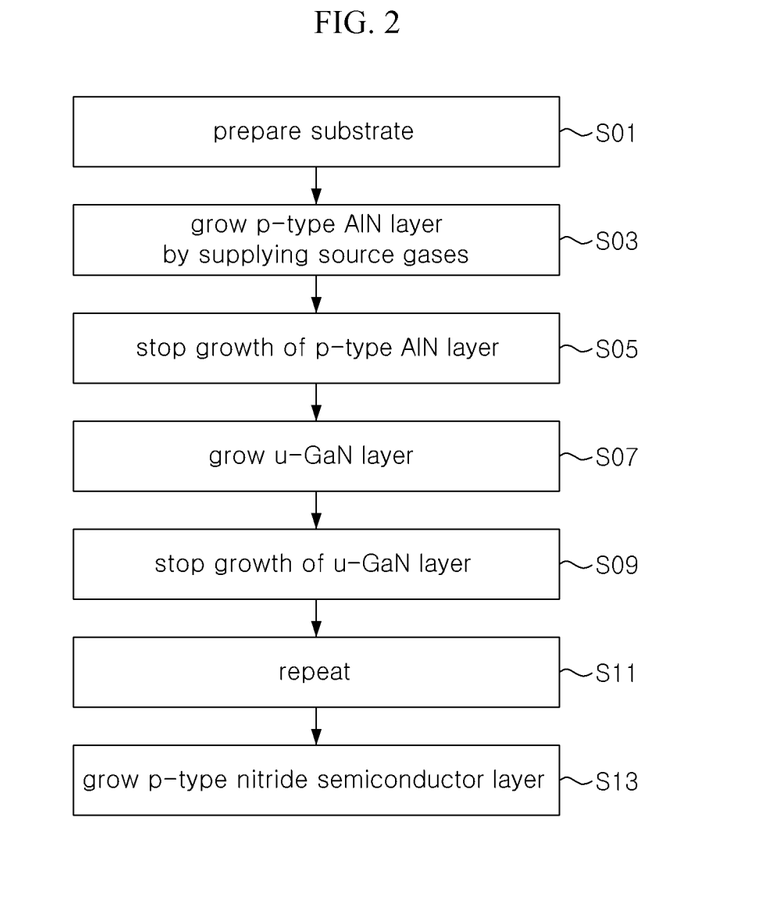
FIG. 2 is a flowchart of a method for manufacturing a light emitting device according to one embodiment of the present invention.
Figure 3:
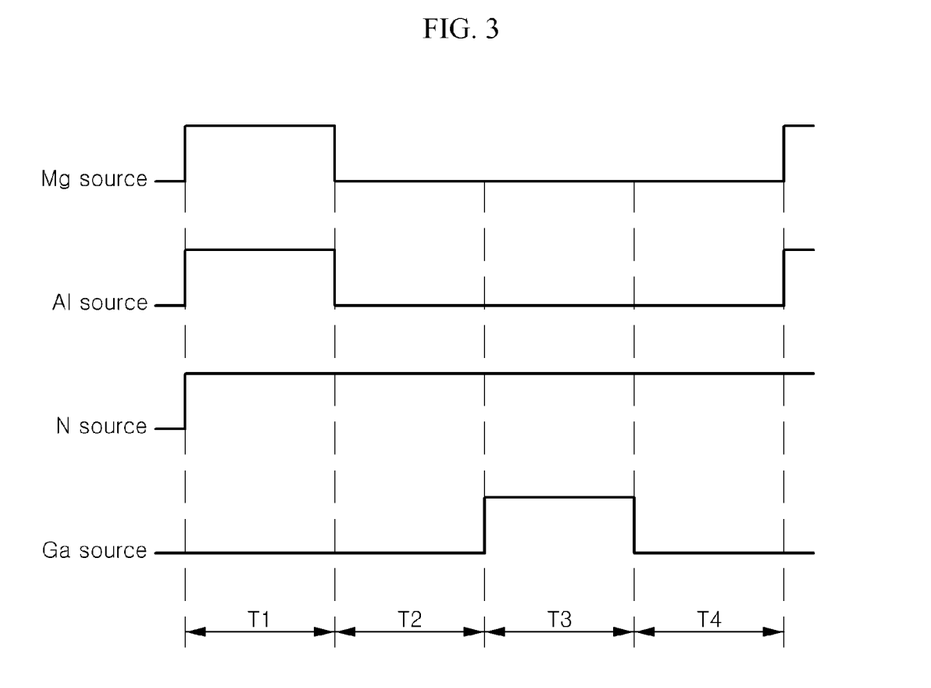
FIG. 3 is a timing diagram illustrating the method for manufacturing the light emitting device according to the embodiment of the present invention.

FIG. 2 is a flowchart of a method for manufacturing a light emitting device according to one embodiment of the present invention, and FIG. 3 is a timing diagram illustrating the method for manufacturing the light emitting device according to the embodiment of the present invention.

Referring to FIG. 2, first, a substrate 21 is prepared in S01. The substrate 21 may have a buffer layer 23, an n-type nitride semiconductor layer 25, and an active layer 27 sequentially formed thereon. Specifically, after the substrate 21 is loaded into a reaction chamber, source gases are supplied into the reaction chamber to deposit the buffer layer 23, the n-type nitride semiconductor layer 25, and the active layer 27 on the substrate 21.

The buffer layer 23 may be formed of nitride or other known materials by any of methods well known to those skilled in the art. Thus, a detailed description of the material and method for forming buffer layer will be omitted herein.

The n-type nitride semiconductor layer 25 may generally be formed using Si as a dopant. Examples of a source gas for Si include inactive gases such as $SiH_4$, $Si_2H_4$, etc. and metal organic sources such as DTBSi. The n-type nitride semiconductor layer 25 may have a Si concentration in the range of $1\times10^{17}/cm^3 \sim 5\times10^{19}/cm^3$, and a thickness of 1.0~5.0 μm.

The active layer 27 may have a single quantum well structure or a multi-quantum well structure. The multi-quantum well structure of the active layer 27 is formed by alternately stacking a quantum well layer of $In_xGa_{1-x}N$ (0.1<x<1) and a quantum barrier layer of $In_yGa_{1-y}N$ (0<y<0.5) 2 or more times to 20 or less times. Preferably, each quantum well layer has a thickness of 1~5 nm and contains indium in the range of 0.1<x<0.4, and each quantum barrier layer has a thickness of 5~40 nm and contains indium in the range of 0.1<y<0.2.

Referring to FIGS. 2 and 3, a p-type AlN layer 28a is grown by supplying a p-type dopant source gas, an N source gas, and an Al source gas into the reaction chamber in S03. The supply of the source gases is performed for a period of time T1.

Examples of the p-type dopant source gas include, but are not limited to, $CP_2Mg$, DmZn, and the like. Examples of the N source gas include, but are not limited to, $NH_3$, dimethylhydrazine (DMHy), and the like. Examples of the Al source gas include, but are not limited to, trimethyl aluminum (TMAl), $Al(CH_3)_3$, and the like. In this embodiment, $CP_2Mg$, i.e. an Mg source gas, is employed as the p-type dopant source gas, but the present invention is not limited thereto.

The period of time T1 can be set to a time for forming the AlN layer 28a to a desired thickness.

Then, the growth of the p-type AlN layer is stopped by stopping the supply of the Mg source gas and the Al source gas into the reaction chamber in S05. Stopping the growth of the p-type AlN layer is performed for a period of time T2.

The reaction chamber is provided with an exhaust pump for discharging the source gases to the outside, so that most of Mg and Al source gases can be discharged from the reaction chamber to the outside in a predetermined period of time after stopping the supply of the source gases. The period of time T2 is set to a time for discharging the Mg and Al source gases from the reaction chamber to the outside, and may be in the range of 1~60 seconds.

When the growth of the p-type AlN layer is stopped at a relatively high temperature, nitrogen elements are dissociated from the nitride semiconductor layer grown on the substrate to form nitrogen holes therein. Thus, $NH_3$ gas is supplied to supply nitrogen elements while the growth of the nitride semiconductor layer is stopped. In this embodiment, if the N source gas comprises $NH_3$, the $NH_3$ gas can be continuously supplied while the supply of the Mg source gas and the Al source gas is stopped. Alternatively, if the N source gas does not comprise $NH_3$, the $NH_3$ gas can be separately supplied during the step of growing the p-type AlN layer in S05.

Then, a Ga source gas and $NH_3$ gas are supplied into the reaction chamber to grow a u-GaN layer 28b on the p-type AlN layer 28a in S07. Examples of the Ga source gas include, but are not limited to, trimethyl gallium (TMGa), triethyl gallium (TEGa), and the like.

The growth of the u-GaN layer 28b is carried out for a period of time T3, which may be in the range of 1~60 seconds.

Then, the growth of the u-GaN layer is stopped by stopping the supply of the Ga source gas into the reaction chamber in S09. Stopping the growth of the u-GaN layer is carried out for a period of time T4.

The reaction chamber is provided with the exhaust pump for discharging the source gases to the outside, so that most Ga source gas can be discharged from the reaction chamber to the outside in a predetermined period of time after stopping the supply of the source gas. The period of time T4 is set to a time for discharging the Ga source gas from the reaction chamber to the outside, and may be in the range of 1~60 seconds.

In S11, the growth of the p-type AlN layer 28a, stopping the growth of the p-type AlN layer 28a, the growth of the u-GaN layer 28b, and stopping the growth of the u-GaN layer 28b are repeated to form an AlN/GaN super lattice layer 28. Here, the p-type AlN layers 28a and the u-GaN layers 28b are alternately stacked to a total thickness of 300~400 Å. The AlN/GaN layer 28 of the super lattice structure is constituted by 10 to 100 pairs of AlN and GaN layers. Accordingly, each thickness of the p-type AlN layers 28a and the u-GaN layers 28b constituting the super lattice layer maybe determined so as to realize the total thickness of the super lattice layer.

When growing the nitride semiconductor layers by MOCVD, the n-type nitride semiconductor layer 25, active layer 27, AlN/GaN layer of the super lattice structure 28, and p-type nitride semiconductor layer 29 can be grown in the same reaction chamber.

Then, an Mg doped p-type nitride semiconductor layer 29 is grown by supplying the Ga source gas, the N source gas, and the Mg source gas into the reaction chamber in S13.

Finally, the p-type nitride semiconductor layer 29 and the active layer 27 on the substrate 21 are subjected to patterning, followed by formation of a transparent electrode layer 31, an n-electrode 33, and a p-electrode 35 to provide a light emitting device as shown in FIG. 1.

According to the embodiments of the present invention, the AlN/GaN layer 28 of the super lattice structure is formed by alternately growing the p-type AlN layer 28a and the u-GaN layer 28b between the active layer 27 and the p-type nitride semiconductor layer 29 such that the AlN/GaN layer 28 can block dislocations from spreading into the nitride semiconductor layer 29 growing on the AlN/GaN layer, thereby improving the hole concentration and crystallinity of the p-type nitride semiconductor layer 29 while preventing diffusion of Mg in the AlN/GaN layer to allow suitable doping of Mg.

Experiment 1

In Experiment 1, relationship between light emission and Mg flow during growth of p-type AlN/u-GaN layers constituting a super lattice structure was measured.

Temperature: 980° C.

Mg 120 sccm, 180 sccm, 240 sccm, 300 sccm, 360 sccm, 480 sccm 60 pairs of p-type AlN/u-GaN layers, time 0.1 min./0.1 min.

Figure 4:
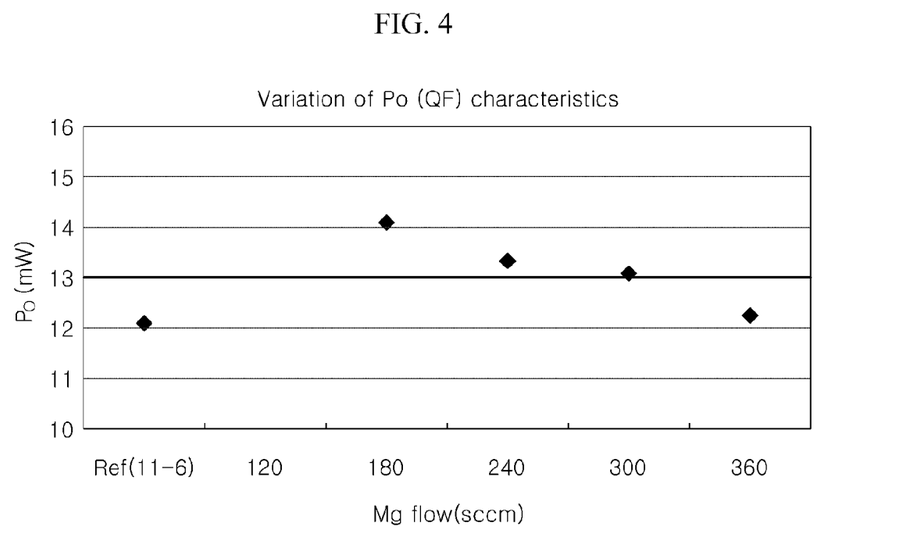
FIG. 4 is a graph depicting the relationship between light emission and Mg flow.

FIG. 4 is a graph depicting the relationship between light emission and Mg flow. As can be seen in FIG. 4, overall light emission was increased due to the use of the AlN/GaN layer of the super lattice structure. When growing the AlN/GaN layer, light emission was varied according to the Mg flow, and maximum light emission was obtained near 180 sccm of Mg.

Experiment 2

Figure 5:
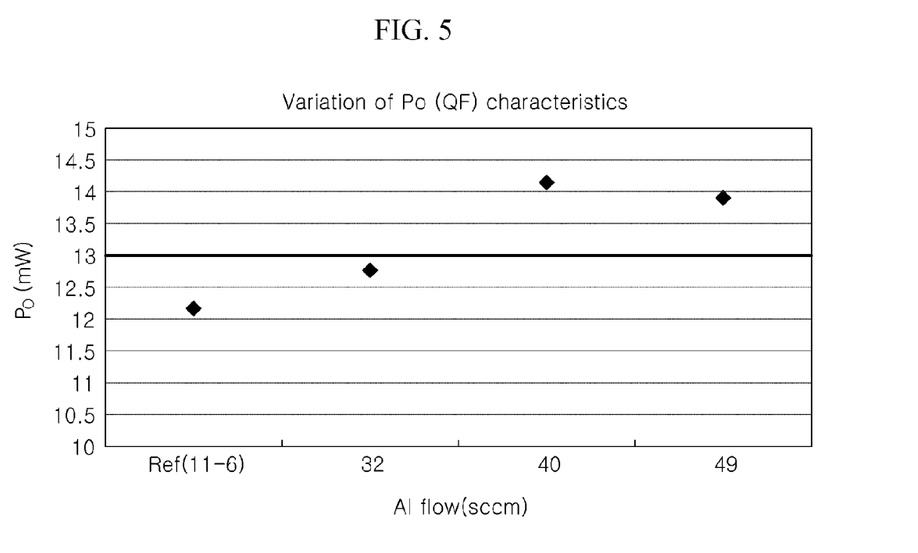
FIG. 5 is a graph depicting the relationship between light emitting amount and Al flow.

In Experiment 2, relationship between light emission and Al flow during growth of p-type AlN/u-GaN layers constituting a super lattice structure was measured.
Temperature: 980° C.
Al: 32/40/31 (−10%); 40/40/31; 49/40/31 (+10%)
60 pairs of p-type AlN/u-GaN layers, time 0.1 min./0.1 min.
FIG. 5 is a graph depicting the relationship between light emission and Al flow. As can be seen in FIG. 5, overall light emission was increased due to the use of the AlN/GaN layer of the super lattice structure. When growing the AlN/GaN layer, the light emission was varied according to the Al flow, and maximum light emission was obtained near 40 sccm of Al.

The method of manufacturing the light emitting device according to the embodiment of the present invention can be applied to a light emitting diode and other nitride-based optical devices such as a laser diode and the like.

Although the present invention has been described with reference to exemplary embodiments, the present invention is not limited to these embodiments.

For example, although the AlN/GaN layer of the super lattice structure has been described as being formed by sequentially growing the AlN layer and the GaN layer in this order, the present invention is not limited to this sequence. That is, the GaN layer can be grown prior to the AlN layer when forming the AlN/GaN layer of the super lattice structure.

Further, in this embodiment, a constant amount of Mg is supplied in each pair of AlN and GaN layers that are alternately stacked to form the AlN/GaN layer of the super lattice structure. However, the present invention is not limited to this configuration. That is, the amount of Mg in each pair of AlN and GaN layers may be varied, for example, gradually increased or decreased from one pair to another.

Further, the AlN/GaN layer is constituted by the p-type AlN layer and the u-GaN layer in this embodiment, but the present invention is not limited to this configuration.

For example, the formation of the AlN/GaN layer of the super lattice structure may be performed by (a) supplying source gases comprising an Mg source gas, an N source gas, and an Al source gas into a reaction chamber to grow an Mg doped p-type AlN layer on the active layer; (b) supplying $NH_3$ gas while stopping the growth of the p-type AlN layer by stopping the supply of the Mg source gas and the Al source gas into the reaction chamber; (c) supplying the Mg source gas, a Ga source gas, and $NH_3$ gas into the reaction chamber to grow a p-GaN layer on the p-type AlN layer; (d) supplying $NH_3$ gas while stopping the growth of the p-GaN layer by stopping the supply of the Mg source gas and the Ga source gas; and repeating the steps of (a) to (d) until the AlN/GaN layer of the super lattice structure comprising the Mg doped p-type AlN layers and the Mg doped p-GaN layers is formed on the active layer.

Alternatively, the formation of the AlN/GaN layer of the super lattice structure may be performed by (a) supplying source gases comprising an N source gas and an Al source gas into the reaction chamber to grow an AlN layer on the active layer; (b) supplying $NH_3$ gas while stopping the growth of the AlN layer by stopping the supply of the Al source gas into the reaction chamber; (c) supplying an Mg source gas, a Ga source gas, and $NH_3$ gas into the reaction chamber to grow a p-GaN layer on the AlN layer; (d) supplying $NH_3$ gas while stopping the growth of the p-GaN layer by stopping the supply of the Mg source gas and the Ga source gas; and repeating the steps of (a) to (d) until the AlN/GaN layer of the super lattice structure comprising the Mg undoped p-type AlN layers and the Mg doped p-GaN layers is formed on the active layer.

Additionally, although the p-type dopant is Mg, and thus, the p-type dopant source gas is $CP_2Mg$ in this embodiment, the p-type dopant may be Zn, and thus, the p-type dopant source gas may be DMZn.

According to the embodiments of the present invention, an AlN/GaN layer of a super lattice structure is formed between a p-type nitride semiconductor layer and an active layer to decrease density of crystal defects, for example, dislocation density, thereby improving crystallinity of the p-type nitride semiconductor layer. Accordingly, the light emitting device according to the embodiments of the present invention has a lower drive voltage, and improved light emitting efficiency and output. Furthermore, Mg is doped through the AlN/GaN layer of the super lattice structure to prevent undesirable diffusion of Mg, so that suitable doping can be obtained, thereby improving light emitting efficiency of the light emitting device.

Although the present invention has been described with reference to the embodiments and the accompanying drawings, the present invention is not limited to the embodiments and the drawings. It should be understood that various modifications and changes can be made by those skilled in the art without departing from the spirit and scope of the present invention defined by the accompanying claims.

What is claimed is:

1. A method for manufacturing a light emitting device, the method comprising:
    forming an n-type nitride semiconductor layer on a substrate;
    forming an active layer on the n-type nitride semiconductor layer;
    forming an AlN/GaN layer of a super lattice structure by alternately growing an AlN layer and a GaN layer on the active layer; and
    forming a p-type nitride semiconductor layer on the AlN/GaN layer of the super lattice structure,
    wherein the GaN layer is doped with a p-type dopant, and the AlN layer is a u-AlN layer,
    wherein the forming of an AlN/GaN layer of a super lattice structure is performed in a reaction chamber in which $NH_3$ gas is continually supplied during the forming of the AlN/GaN layer,
    wherein the forming of an AlN/GaN layer of a super lattice structure comprises:
        (a) supplying source gases comprising an N source gas and an Al source gas into the reaction chamber to grow the AlN layer on the active layer;
        (b) supplying $NH_3$ gas while stopping the growth of the AlN layer by stopping the supply of the Al source gas into the reaction chamber;
        (c) supplying a p-type dopant source gas, a Ga source gas, and $NH_3$ gas into the reaction chamber to grow a p-GaN layer on the AlN layer;
        (d) supplying $NH_3$ gas while stopping the growth of the p-GaN layer by stopping the supply of the p-type dopant source gas and the Ga source gas; and
        repeating (a) to (d) until the AlN/GaN layer of the super lattice structure is formed on the active layer, wherein when the supply of the Al source gas is stopped during growth of the AlN layer, $NH_3$ gas is continually supplied in the reaction chamber while the Al source gas is discharged from the reaction chamber, and wherein when the supply of the p-type dopant source gas and the Ga source gas is stopped during growth of the GaN layer, $NH_3$ gas is continually supplied in the reaction chamber while the p-type dopant source gas and the Ga source gas is discharged from the reaction chamber.

2. The method according to claim 1, wherein the p-type nitride semiconductor layer is a p-GaN layer.

3. The method according to claim 1, wherein the GaN layer is thicker than the AlN layer.

4. The method according to claim 1, wherein the p-type dopant source gas is $CP_2Mg$ or DMZn.

5. The method according to claim 1, wherein the AlN/GaN layer of a super lattice structure is formed by alternately growing a single AlN layer and a single GaN layer on the active layer.

6. The method according to claim 1, wherein the AlN/GaN super lattice structure is formed at a constant temperature.

* * * * *